United States Patent [19]
Takahashi et al.

[11] Patent Number: 5,569,573
[45] Date of Patent: Oct. 29, 1996

[54] LITHOGRAPHIC PRINTING ORIGINAL PLATES AND PLATEMAKING PROCESS USING THE SAME

[75] Inventors: Gensho Takahashi; Masaaki Kurihara, both of Fuji, Japan

[73] Assignee: Asahi Kasei Kogyo Kabushiki Kaisha, Osaka, Japan

[21] Appl. No.: 349,158

[22] Filed: Dec. 2, 1994

[30] Foreign Application Priority Data

Apr. 20, 1993 [JP] Japan .................................. 5-115185

[51] Int. Cl.⁶ .............................. G03F 7/00; B41N 1/00
[52] U.S. Cl. .................... 430/138; 430/300; 430/302; 430/330; 430/964; 101/453
[58] Field of Search ................... 430/138, 300, 430/330, 302, 283.1, 284.1, 285.1, 964; 101/453

[56] References Cited

U.S. PATENT DOCUMENTS

| | | |
|---|---|---|
| 4,034,183 | 7/1977 | Uhlig et al. . |
| 4,063,949 | 12/1977 | Uhlig et al. . |
| 5,368,973 | 11/1994 | Hasegawa ............................ 430/302 |

FOREIGN PATENT DOCUMENTS

| | | |
|---|---|---|
| 62-1587 | 1/1987 | Japan . |
| 62-164596 | 7/1987 | Japan . |
| 62-164049 | 7/1987 | Japan . |
| 63-64747 | 3/1988 | Japan . |
| 01-113290 | 5/1989 | Japan . |
| 03-108588 | 5/1991 | Japan . |
| 05-8575 | 1/1993 | Japan . |

*Primary Examiner*—Thorl Chea
*Attorney, Agent, or Firm*—Pennie & Edmonds

[57] ABSTRACT

The present invention relates to a thermosensitive lithographic printing original plate comprising a substrate, a hydrophilic layer containing a hydrophilic binder polymer, and a microcapsuled oleophilic material which forms an image area by heating; the hydrophilic binder polymer having a three-dimensional cross-link and a functional group which chemically combines with the oleophilic material in the microcapsule when the microcapsule is decomposed, and the microcapsuled oleophilic material having a functional group which chemically combines with the hydrophilic binder polymer when the microcapsule is decomposed.

The thermosensitive lithographic printing original plate of the present invention is excellent in printing durability and storage property and provides prints having clear images because the plate does not collect scumming. Further, development is not required in the platemaking process so that there are no problems with waste treatment and the like. Consequently, the original plate can be practically applied not only to a light printing such as a printing in offices but also to a rotary press of newspaper, form printing and the like.

25 Claims, No Drawings

LITHOGRAPHIC PRINTING ORIGINAL PLATES AND PLATEMAKING PROCESS USING THE SAME

TECHNICAL FIELD

The present invention relates to a direct thermosensitive lithographic printing original plate for offset printing showing high printing durability and not requiring a developing process, and to a platemaking process using the same.

BACKGROUND ART

Various platemaking processes for lithographic printing plates as well as plate materials have been proposed, as seen in the wide use of computers. From the standpoint of practical use, a lithographic printing original plate is prepared by transferring block copies from a positive/negative film. On the other hand, electrophotography and Silver lithographic plates, which are directly made from block copies without using a positive/negative film, have also been developed. Further, so-called "Computer to Plate (CTP)" type plate material has been proposed. In the use of this plate material, graphic information made by computer type setting and DTP (Desktop Publishment) is directly printed onto a plate by using a laser or a thermal printing-head without visualized hard media. This plate material has not been applied to practical use yet. However, since CTP enables the rationalization and shortening of the platemaking process as well as the reduction of material costs, there is a great demand for practical use of the CTP in a field such as news printing where CTS (Cold Type System) is employed for all printings.

Photosensitive plates, thermosensitive plates, and plates made by electrical energy have been known as CTP type plate material. The photosensitive plate and the plate made by electrical energy have not been used in practice, since not only the price of those plates are higher than that of conventional presensitized plates (PS plates) but also platemaking machine used for preparing them are large-sized and expensive. Moreover, they have a problem in that they require waste treatment of a developing solution.

The thermosensitive plate materials are developed for use in light printing, e.g., for printing in offices. Japanese Patent Application Laid-Open Nos. 64747/1988 and 113290/1989 disclose printing plate materials whose thermosensitive layer arranged on a substrate contains a heat-fusible resin and a thermoplastic resin, and which are changed from hydrophilic to oleophilic by fusing with thermal imaging. U.S. Pat. Nos. 4,034,183 and 4,063,949 disclose printing plate materials prepared by irradiating a hydrophilic polymer layer coated on a substrate with laser to change hydrophilic to oleophilic. However, these printing plate materials have disadvantages in that the non-image areas are stained with ink due to a heat-fusible resin presented on the surface of the layer, in that the printing durability of the plates is insufficient, and the ability to design various types of desired plates is limited. Japanese Patent Application Laid-Open Nos. 108588/1991 and 8575/1993 disclose a printing plate material prepared by coating a substrate with a thermal recording layer composed of a microcapsuled heat-fusible substance and a binder resin, and heating it to change to oleophilic. However, they do not show sufficient printing durability since the microcapsuled heat-fusible substances used for those plates are not reactive. On the other hand, Japanese Patent Application Laid-Open Nos. 164596/1987 and 164049/1987 disclose a lithographic printing original plate having a recording layer which comprises a hydrophilic binder polymer containing an active hydrogen and a block isocyanate, and platemaking processes using the same. These plate materials further need a developing process in order to eliminate non-printed areas after being imaged.

Furthermore, the direct type of lithographic printing plate materials include a direct writing type lithographic printing plate material whose image areas are formed on the surface of the hydrophilic layer by external methods such as ink-jet and toner transfer. Japanese Patent Application Laid-Open No. 1587/1987 discloses a printing plate material coated with a non-reactive microcapsuled heat-fusible substance, which becomes a toner receiving layer by thermal imaging. The printing plate material cannot be used as a printing plate until the toner receiving layer accepts oleophilic toner. That is, the printing plate material does not obtain image areas after being imaged.

Thus conventional thermosensitive printing plate materials are poor in printing durability or in oleophilic property so that they are used only for light printing. In addition, some of the thermosensitive printing plate materials require a developing process during platemaking.

As described above, conventional techniques are insufficient in the performance of the printing plates and platemaking machines, in the efficiency of platemaking process as well as in the price of printing materials, printing plates and platemaking machines for practical use. The present invention aims at solving the above-mentioned problems of the conventional direct type lithographic printing plate materials for offset printing. One object of the present invention is to provide a low-price lithographic printing original plate which does not collect scum, in which a lithographic printing plate showing high printing durability and high accuracy in size and prints having clear images are obtained. The other object is to provide a lithographic printing original plate which is prepared without a developing process requiring waste treatment of developing solution and which can be made without use of specific large-scaled and expensive platemaking machines, and a platemaking process using the same.

DISCLOSURE OF THE INVENTION

The present invention relates to a thermosensitive lithographic printing original plate comprising a substrate, a hydrophilic layer containing a hydrophilic binder polymer, and a microcapsuled oleophilic material which forms an image area by heating; the hydrophilic binder polymer having a three-dimensional cross-link and a functional group which chemically combines with the oleophilic material in the microcapsule when the microcapsule is decomposed, and the microcapsuled oleophilic material having a functional group which chemically combines with the hydrophilic binder polymer when the microcapsule is decomposed.

The present invention also relates to a thermosensitive lithographic printing plate material comprising a substrate, a hydrophilic layer containing hydrophilic binder polymer, and a microcapsuled oleophilic material which forms an image area by heating; the hydrophilic binder polymer having a functional group capable of three-dimensionally cross-linking and a functional group which chemically combines with the oleophilic material in the microcapsule when the microcapsule is decomposed, and the microcapsuled oleophilic material having a functional group which chemically combines with the hydrophilic binder polymer in the microcapsule when the microcapsule is decomposed.

Furthermore, the present invention relates to platemaking processes of the above thermosensitive lithographic printing original plate and thermosensitive lithographic printing plate material, and a printing plate obtained therefrom.

The hydrophilic layer of the present invention having three-dimensionally cross-linked hydrophilic binder polymer repels ink and comprises a non-image area. The three-dimensional cross-link gives the hydrophilic layer excellent printing durability, since the hydrophilic layer is not swelled by dampening water to maintain its mechanical property as well as the bonding strength between the substrate and the hydrophilic layer.

The hydrophilic layer can be three-dimensionally cross-linked when imaged or after being imaged. A hydrophilic binder polymer which does not have the three-dimensional cross-link before platemaking can be also used as a lithographic printing material in the present invention. It is preferred that the hydrophilic layer should be three-dimensionally cross-linked before platemaking from the standpoint of avoiding damage while handling and to avoid adhesion of the fused hydrophilic layer to a thermal printhead when imaged with a thermal printing-head.

The three-dimensionally cross-linked hydrophilic binder polymer of the present invention is a network polymer comprising carbon-carbon bonds, which have, as a side chain, at least one type and a plurality of hydrophilic functional groups such as a carboxyl group or its salt, a phosphoric group or its salt, a sulphonic group or its salt, an amino group or its salt, a hydroxyl group, a amide group, and a polyoxyethylene group; a network polymer comprising carbon atoms or carbon-carbon bonds, which are connected by one or more types of hetero atoms selected from oxygen, nitrogen, sulpher, and phosphorous; or a network polymer comprising carbon atoms or carbon-carbon bonds, which are connected by one or more types of hetero atoms selected from oxygen, nitrogen, sulpher and phosphorous and which network polymer has, as a side chain, at least one type and a plurality of hydrophilic functional groups such as a carboxyl group or its salt, a phosphoric group or its salt, a sulphonic group or its salt, an amino group or its salt, a hydrogen group, an amide group, and a polyoxyethylene group; the network polymers can include poly(meth)acrylate type, polyoxyalkylene type, polyurethane type, epoxy ring opening addition polymerization type, poly(meth)acrylic acid type, poly(meth)acrylamide type, polyester type, polyamide type, polyamine type, polyvinyl type, polysaccharide type and composite type thereof.

Of these, the hydrophilic binder polymer containing a repeating segment having any of a hydroxyl group, a carboxyl group or its alkaline metal salt, a sulphonic group or its amine salt, alkaline metal salt or its alkaline earth metal salt, an amino group or its hydrohalogenic acid salt, an amide group and a combination thereof, and the hydrophilic binder polymer having a polyoxyethylene group in a part of its segment as well as the above-listed side chains are preferred for their good hydrophilic property. Further, a hydrophilic binder polymer having a urea or urethane bond in its segment or side chain is more preferred since printing durability of a non-image area is improved along with hydrophilic property.

The ratio of the hydrophilic functional group in the polymer can be experimentally decided by the following methods in view of the types of segment in a main chain and the hydrophilic functional group used. The hydrophilic property of the hydrophilic binder polymer in the present invention is determined by examining the presence of ink scumming collected on the printing paper according to the printing test described in the Examples below, or by examining the difference in reflection density between the paper and the non-image areas of the paper (e.g. it is measured by reflection densitometer DM400 manufactured by DAINIPPON SCREEN MFG. CO., LTD.). Alternatively, it is determined by examining the presence of kerosine in the sample according to a method for measuring a contact angle measured with an oil drop in water test (e.g. it is measured by contact angle meter CA-A type manufactured by KYOWA INTERFACE SCIENCE CO., LTD.). In the former determination, when the presence of ink is not recognized by naked eyes or the difference between paper reflection density is 0.02 or less, the hydrophilic property is acceptable. When the presence of ink is recognized by naked eyes and the difference of paper reflection density is over 0.02, the hydrophilic property is not acceptable. In the latter method of determination, the contact angle of the sample must be over about 150 degrees and for the printing employing low viscosity ink such as newspaper printing, preferably 160 degrees or more. For the printing employing high viscosity ink which is kneaded prior to printing, it must be over about 135 degrees.

The hydrophilic binder polymer of the present invention may contain a variety of other components listed below, if necessary.

Representative examples of three-dimensionally cross-linked hydrophilic binder polymer are as follows.

For the hydrophilic binder polymer, a hydrophilic homopolymer or a hydrophilic copolymer is synthesized using one or more hydrophilic monomers having a hydrophilic group selected from a carboxyl group or its salt, a sulfonic group or its salt, a phosphoric group or its salt, an amino group or its salt, a hydroxyl group, an amide group and an ether group such as a (meth)acrylic acid or its alkali metal salt and amine salt, an itaconic acid or its alkali metal salt and amine salt, 2-hydroxyethyl(meth)acrylate, (meth) acrylamide, N-monomethylol(meth)acrylamide, N-dimethylol(meth)acrylamide, allyl amine or its hydrohalogenic acid salt, 3-vinylpropionic acid or its alkali metal salt and amine salt, vinyl sulfonic acid or its alkali metal salt and amine salt, 2-sulphoethyl(meth)acrylate, polyoxyethylene glycol mono(meth)acrylate, 2-acrylamide-2-methylpropanesulfonic acid, and, acid phosphoxy polyoxyethylene glycol mono(meth)acrylate.

For hydrophilic binder polymers having a functional group such as a carboxyl group or its salt, an amino group or its salt, a hydroxyl group, and an epoxy group introduce an additional polymerizable ethylenically unsaturated group such as a vinyl group, an allyl group and a (meth)acryl group or a ring formation group such as a cinnamoyl group, a cinnamylidene group, a cyanocinnamylidene group and p-phenylenediacrylate group. The obtained polymers containing these unsaturated groups are mixed with monofunctional and polyfunctional monomers copolymerizable with the unsaturated groups, the below-mentioned polymerization initiator, and the below-mentioned other components, if necessary. Then, it is dissolved in a proper solvent to prepare a dope. The dope is applied to a substrate, and cross-linked after or during drying to obtain a three-dimensionally cross-linked binder polymer.

For hydrophilic binder polymers having a functional group containing active hydrogen such as a hydroxyl group, an amino group and a carboxyl group are mixed with an isocyanate compound or a blocked polyisocyanate, and the below-mentioned other components. Then, the obtained mixture is dissolved in a solvent which does not contain the active hydrogen to prepare a dope. The resulting dope is applied to a substrate, and three-dimensionally cross-linked after or during drying to obtain a cross-linked binder polymer.

Furthermore, a monomer having a glycidyl group such as glycidyl (meth)acrylate, a carboxylic group such as (meth)acrylic acid, and/or an amino group can be used as a copolymerizable component of the hydrophilic binder polymer. The hydrophilic binder polymers having a glycidyl group are three-dimensionally cross-linked by a ring-opening reaction, in which the polymer reacts with, as a cross-linking agent, α, ω-alkane or alkenedicarboxylic acid such as 1,2-ethanedicarboxylic acid, and adipic acid, a polycarboxylic acid such as 1,2,3-propanetricarboxylic acid, and trimellitic acid, a polyamine compound such as 1,2-ethanediamine, diethylenediamine, diethylenetriamine, and α, ω-bis-(3-aminopropyl)-polyethylene glycol ether, an origoalkylene or polyalkylene glycol such as ethylene glycol, propylene glycol, diethylene glycol, and tetraethylene glycol, and a polyhydroxy compound such as trimethylolpropane, glycerin, pentaerythritol, or sorbitol. The hydrophilic binder polymers having a carboxylic group and an amino group are three-dimensionally cross-linked by an epoxy ring-opening reaction, in which the binder polymer reacts with a polyepoxy compound, as a cross-linker, such as ethylene or propylene glycol diglycidyl ether, polyethylene or polypropylene glycol diglycidyl ether, neopentyl glycol diglycidyl ether, 1,6-hexanediol diglycidyl ether, or trimethylolpropane triglycidyl ether.

When a polysaccharide such as cellulose derivatives, a polyvinyl alcohol or its partially saponified derivatives, a glycidol homopolymer or copolymer, or their derivatives are used as a hydrophilic binder polymer, the above-mentioned cross-linkable functional groups are introduced into the polymer through the hydroxyl groups which the above compounds possess. As a result, a three-dimensional cross-link is accomplished according to the above method.

Furthermore, a hydrophilic polyurethane precursor is produced by reacting a polyol having a hydroxyl group such as polyoxyethylene glycol at the termini of the polymer or a polyamine having an amino group at the termimi of the polymer with polyisocyanate such as 2,4-tolylene diisocyanate, 2,6-tolylene diisocyanate, 1,6-hexamethylene diisocyanate, or isophorone diisocyanate. Then, an additional polymerizable ethylenically unsaturated group or a ring forming group is introduced into the hydrophilic polyurethane precursor to obtain a hydrophilic binder polymer. The hydrophilic binder polymer can be three-dimensionally cross-linked by the above-mentioned method. When the hydrophilic polyurethane precursor has an isocyanate group at its termimi, the precursor is reacted with a compound containing an active hydrogen such as glycerol mono(meth)acrylate, 2-hydroxyethyl(meth)acrylate, 2-hyroxypropyl(meth)acrylate, N-monomethylol(meth)acrylamide, N-dimethylol(meth)acrylamide, (meth)acrylic acid, cinnamic acid, or cinnamic alcohol. When the precursor has a hydroxyl group or an amino group at its termini, it is reacted with (meth)acrylic acid, glycidyl (meth)acrylate and/or 2-isocyanatoethyl (meth) acrylate.

When polymers comprising a polybasic acid and a polyol, or a polybasic acid and a polyamine are used as a hydrophilic binder polymer, they are applied on a substrate. Then, they are heated for a three-dimentsional cross-linking. When casein, glue, and gelatin are used as a hydrophilic binder polymer, their water-soluble colloidal compounds are heated for three-dimensional cross-linking to obtain a net structure.

Further, a hydrophilic binder polymer can be produced by reacting a hydrophilic polymer having a hydroxyl group or an amino group with a polybasic acid anhydride containing two or more acid anhydride groups in one molecule to obtain a three-dimensionally cross-linked hydrophlic binder polymer. The hydrophilic polymer includes a homopolymer or copolymer comprising a hydroxyl group containing monomers such as 2-hydroxyetyl(meth)acrylate and vinyl alcohol, and allyl amine; partially saponified polyvinyl alcohol; a polysaccharide such as cellulose derivatives; and glycidol homopolymer or copolymer. Representative examples of the polybasic acid anhydride used are ethylene glycol bis anhydro trimellitate, glycerol tris anhydro trimellitate, 1,3,3a,4, 5,9b-hexahydro-5-(tetrahydro- 2,5-dioxo-3-furanyl)naphtho [1,2-C]furanyl-1,3-dione, 3,3',4,4'-diphenylsulfone tetracarboxylic dianhydride, 1,2,3,4-butanetetracarboxylic dianhydride and the like.

When the hydrophilic binder polymer comprises polyurethane having isocyanate groups at its termini and a compound containing active hydrogen such as polyamine and polyol, these compounds and other components listed below are dissolved or dispersed in a solvent. They are applied to the substrate, and the solvent is removed. Then, the plate is cured at a temperature at which a microcapsule is not broken to obtain three dimensional cross-linking. In this case, hydrophilic property is given by introducing a hydrophilic functional group into segments of either polyurethane or a compound containing active hydrogen or the segments both of them, or into their side chain. The segments and functional groups possessing hydrophilic property can be selected from the above list.

The polyisocyanate compounds used in the present invention include 2,4-tolylene diisocyanate, 2,6-tolylene diisocyanate, 4,4'-diphenylmethane diisocyanate, 1,5-naphthalene diisocyanate, tolidine diisocyanate, 1,6-hexamethylene diisocyanate, isophorone diisocyanate, xylene diisocyanate, lysine diisocyanate, triphenylmethane triisocyanate, bicycloheptane triisocyanate.

In some cases, it is preferred to block (mask) the isocyanate groups by the conventional method for the purpose of preventing the isocyanate groups from changing at handling before and after the coating process. For example, the isocyanate groups can be blocked with acid sodium sulfite, aromatic secondary amine, tetrary alcohol, amide, phenol, lactam, heterocyclic compounds, ketoxime and the like according to the methods disclosed in *Lecture for Plastic Material* vol. 2 —Polyurethane Resin—(IWATA, Keiji, Nikkan Kogyo Shimbun, 1974) pp. 51–52 and Polyurethane Resin Handbook (IWATA, Keiji, Nikkan Kogyo Shimbun, 1987) pp. 98, 419, 423 and 499. Preferably, the isocyanate groups are blocked with a compound having a low recovering temperature of isocyanate and hydrophilic property such as acid sodium sulfite.

An additional polymerizable unsaturated group may be added to either non-blocked or blocked polyisocyanates as mentioned above for the purpose of strengthening the cross-link or using it for a reaction with an oleophilic material.

The degree of cross-link, i.e., an average molecular weight between cross-links, of the hydrophilic binder polymer of the present invention, which differs depending on the type of segments used and the type and amount of associative functional groups, is determined according to the required printing durability. Generally, the average molecular weight between cross-links is fixed between 500 and 50,000. When it is smaller than 500, the printing plate is likely to be brittle and printing durability is deteriorated. When it is greater than 50,000, printing durability may be deteriorated due to the swelling of dampening water. In view of the balance of printing durability and hydrophilic property, the average molecular weight between cross-links is preferably 800 to 30,000, more preferably 1,000 to 10,000.

Of these, the hydrophilic binder polymers comprising hydrophilic homopolymer or copolymer synthesized using one or more hydrophilic monomers having a hydrophilic group selected from a carboxyl group or its salt, a sulfonic group or its salt, a phosphoric group or its salt, an amino group or its salt, a hydroxyl group, an amide group and an ether group such as a (meth)acrylic acid or its alkali metal salt and amine salt, an itaconic acid or its alkali metal salt and amine salt, 2-hydroxyethly(meth)acrylate, (meth)acrylamide, N-monomethylol(meth)acrylamide, N-dimethylol-(meth)acrylamide, allylamine or its hydrohalogenic acid salt, 3-vinyl propionic acid or its alkali metal salt and amine salt, vinyl sulfonic acid or its alkali metal salt and amine salt, 2-sulphoethylene(meth)acrylate, polyoxyethylene glycol mono(meth)acrylate, 2-acrylamide-2-methylpropane sulfonic acid and acid phosphoxy polyoxyethylene glycol mono(meth)acrylate: or polyoxymethylene glycol or polyoxyethylene glycol which are three-dimensionally cross-linked according to the above mentioned methods are preferred.

The hydrophilic binder polymer of the present invention may be used with the following monofunctional monomer or polyfunctional monomer. Representative examples include, those disclosed in *Handbook for Cross-Linking Agents*, edited by YAMASHITA, Shinzo and KANEKO, Tosuke, Taiseisha, 1981; *Hardening System with Ultraviolet*, KATO, Kiyoshi, Comprehensive Technology Center, 1989; *UV•EB Hardening Handbook* (Material), edited by KATO, Kiyoshi, Kobunshi Kankokai, 1985; pp. 102–145 of *New Practical Technology for Photosensitive Resin*, supervised by AKAMATSU, Kiyoshi, CMC, 1987 and the like, N,N'-methylenebisacrylamide, (meth)acryloylmorpholine, vinyl pyridiene, N-methyl(meth)acrylamide, N,N-dimethyl(meth)acrylamide, N,N-dimethylaminopropyl(meth)acrylamide, N,N-dimethylaminoethyl(meth)acrylate, N,N-diethylaminoethyl(meth)acrylate, N,N-dimethylaminoneopentyl(meth)acrylate, N-vinyl-2-pyrrolidone, diacetone acrylamide, N-methylol(meth)acrylamide, parastyrene sulphonic acid or its salt, methoxytriethylene glycol (meth)acrylate, methoxytetraethylene glycol (meth)acrylate, methoxypolyethylene glycol (meth)acrylate (PEG number-average molecular weight: 400), methoxypolyethylene glycol (meth)acrylate (PEG number-average molecular weight: 1,000), butoxyethyl(meth)acrylate, phenoxyethyl(meth)acrylate, phenoxydiethylene glycol (meth)acrylate, phenoxypolyethylene glycol (meth)acrylate, nonylphenoxyethyl(meth)acrylate, dimethylol tricyclodecane di(meth)acrylate, polyethylene glycol di(meth)acrylate (PEG number-average molecular weight: 400), polyethylene glycol di(meth)acrylate (PEG number-average molecular weight: 600), polyethylene glycol di(meth)acrylate (PEG number-average molecular weight: 1,000), polypropylene glycol di(meth)acrylate (PPG number-average molecular weight: 400), 2,2-bis[4-(methacryloyloxyethoxy)phenyl]propane, 2,2-bis[4-(methacryloyloxy•diethoxy)phenyl]propane, 2,2-bis[4-methacyloyloxy•polyethoxy)phenyl]propane or its acrylate, β-(meth)acryloyl-oxyethyl hydrogen phthalate, β-(meth) acryloyl-oxyethyl hydrogen succinate, polyethylene or polypropylene glycol mono(meth)acrylate, 3-chloro-2-hydroxypropyl(meth)acrylate, 1,3-butylene glycol di(meth)acrylate, 1,6-hexanediol di(meth)acrylate, neopentyl glycol di(meth)acrylate, trimethylolpropane tri-(meth)acrylate, tetramethylolmethane tri(meth)acrylate, tetramethylolmethane tetra(meth)acrylate, isobornyl(meth)acrylate, lauryl(meth)acrylate, tridecyl(meth)acrylate, stearyl(meth)acrylate, isodecyl(meth)acrylate, cyclohexyl(meth)acrylate, tetrafurfuryl(meth)acrylate, benzyl(meth)acrylate, mono(2-(meth)acryloyl-oxyethyl)acid phosphate, glycerin mono(meth)acrylate or glycerin di(meth)acrylate, tris(2-(meth)acryloyl-oxyethyl)isocyanurate, N-phenylmaleimide, N-(meth)acryloxy succinate imide, N-vinylcarbazole, divinylethylene urea, divinylpropylene urea and the like.

When the three-dimensional cross-linking reaction is carried out using addition polymerizable ethylenically unsaturated groups, the known light polymerization initiator or heat polymerization initiator is preferably employed from the standpoint of reaction efficiency.

The light polymerization initiators used in the present invention include benzoin, benzoin isobutyl ether, benzoin isopropyl ether, benzophenone, Michler's ketone, xanthone, thioxanthone, chloroxanthone, acetophenone, 2,2-dimethoxy-2-phenylacetophenone, benzil, 2,2-dimethyl-2-hydroxyacetophenone, (2-acryloyl-oxyethyl)(4-benzoylbenzyl)dimethyl ammonium bromide, (4-benzoylbenzyl)trimethyl ammonium chloride, 2-(3-dimethylamino-2-hydroxypropoxy)-3,4-dimethyl-9H-thioxanthone- 9-on mesochloride, 1-phenyl-1,2-propanedione-2-(O-benzoyl)oxime, thiophenol, 2-benzothiazolethiol, 2-benzoxazolethiol, 2-benzimidazolethiol, diphenylsulphide, decylphenylsulphide, di-n-butyldisulphide, dibenzylsulphide, dibenzoyldisulphide, diacetyldisulphide, dibornyldisulphide dimethoxy xanthogene disulphide, tetramethylthiuram monosulphide, tetramethylthiuram tetrasulphide, benzyldimethyldithiocarbamate quinoxaline, 1,3-dioxolane, N-lauryl pyridinium and the like. The light polymerization initiator, which has absorption bands in the region of the wavelength of the light source used in the curing process and which is able to be dissolved or dispersed in the solvent used for preparing the dope, is selected from the above-listed initiators according to the desire. Generally, the light polymerization initiator which is dissolved in the solvent used is preferred due to its high reaction efficiency.

The light cation polymerization initiators used in the present invention include aromatic diazonium salt, aromatic iodonium salt, aromatic sulphonium salt and the like. When this initiator is used, epoxy groups can be used as a cross-linking reaction species. In this case, the above-mentioned organic compound containing epoxy groups is used as a cross-linking agent or as a hydrophilic binder polymer, or the epoxy groups are introduced into the hydrophilic binder polymer.

When the three-dimensional cross-linking is carried out by a light dimerization reaction, various sensitizing agents which are commonly used for the reaction such as 2-nitrofluorene and 5-nitroacenaphthene can be used.

In addition, the known polymerization initiators can be used, which are disclosed in chaps. 2 and 4 of *Sensitizing Agent*, TOKUMARU, Katsumi et al., Kodansha, 1987; pp. 62–147 of *Hardening System with Ultraviolet*, Kato, Kiyoshi, Comprehensive Technology Center, 1989; and "Fine Chemical vol. 20, nos. 4 and 16" 1991.

The amount of the above polymerization initiators is in the range of 0.01 to 20% by weight based on the amount of the effective components, i.e., components excluding the solvent, in the dope. When it is less than 0.01% by weight, the efficiency of the initiator is not exhibited. When it is more than 20% by weight, the desired printing durability may not be exhibited since the active light initiator itself absorbs light and light does not sufficiently reach the inside of the plate. For practical use, the amount of the polymerization initiator is preferably determined in the range of 1 to 10% by weight, depending on the dope composition which is prepared according to the balance of initiator efficiency and scumming at non-image areas.

As the exposing light source, the known source such as a metal halide lamp, a high pressure mercury vapor lamp, a super-high pressure mercury vapor lamp and a chemical lamp can be used. In the case that the heat generated from the exposing light source may break capsules, exposing should be carried out while cooling.

As the heat polymerization initiators used in the present invention, the known peroxides, azo compounds and redox initiators such as benzoyl peroxide, 2,2-azobisisobutylnitrile and persulfate-sodium bisulfite can be used. In use, the initiators must be reacted at a lower temperature than the temperature microcapsules are broken. The amount of the heat polymerization initiators is preferably in the range of 0.01 to 10% by weight based on the amount of the dope composition excluding the solvent. When it is less than 0.01% by weight, the hardening period is unpreferably prolonged. When it is more than 10% by weight, gelation may be caused due to the decomposition of the heat polymerization initiator during the preparation of the dope. In view of efficiency and handling, the preferred amount is in the range of 0.1 to 5% by weight.

It is necessary that the hydrophilic binder polymer of the present invention contains functional groups which chemically combine with an oleophilic material in the microcapsule. High printing durability can be attained by chemical bonding between the polymer and the material. The oleophilic material in the microcapsule is reacted with the three-dimensionally cross-linked hydrophilic binder polymer by introducing the desired functional groups which react with the reactive functional groups of the following oleophilic material into the polymer while or after the hydrophilic binder polymer is prepared using a monomer having the above functional groups. The preferred reaction of the hydrophilic binder polymer with the oleophilic material is a high rate reaction such as a urethane or urea reaction i.e., a reaction of a hydrophilic binder polymer having a hydroxyl group, a carboxyl group or an amino group with an oleophilic material having an isocyanate group; a reaction of a hydrophilic binder polymer having a hydroxyl group, carboxyl group or an amino group with an oleophilic material having an epoxy group; and an addition polymerization reaction of unsaturated groups. A ring opening addition reaction of a hydrophilic binder polymer having an anhydride group with an oleophilic material having a hydroxyl group, an amino group or an imino group and an addition reaction of an unsaturated group with thiol are also acceptable. For the purpose of improving printing durability, it is preferred that the above chemical bond has a three-dimensional cross-linking structure.

The oleophilic material of the present invention has a functional group reacting with the above hydrophilic binder polymer. The oleophilic material comes out from the capsule by thermal imaging and immediately reacts with the hydrophilic binder polymer to form image areas which receives ink, chemically combined with the hydrophilic binder polymer. In order to improve printing durability, the oleophilic material itself preferably has a cross-linking structure.

There can be used, as the oleophilic material of the present invention, isocyanates such as phenylisocyanate, 2,4-tolylene diisocyanate, 2,6-tolylene diisocyanate, 4,4'-diphenylmethane diisocyante, 3,3'-dimethylbiphenyl-4,4'-diisocyanate, 1,5-naphthalene diisocyanate, tolidine diisocyanate, 1,6-hexamethylene diisocyanate, isophorone diisocyanate, xylene diisocyanate, lysine diisocyanate, triphenylmethane triisocyanate, bicyclloheptane triisocyanate, polymethylene polyphenyl isocyanate, polymeric polyisocyanate; isocyanate compounds such as polyisocyanate like adducts of trimethylol propane and the above diisocyanate like 1,6-hexane diisocyanate or 2,4-tolylene diisocyanate (molar ratio of 1:3), and oligomer or polymer of 2-isocyanatoethyl(meth)acrylate; polyfunctional (meth) acryl monomers such as N,N'-methylene bisacrylamide, (meth)acryloylmorpholine, vinyl pyridine, N-methyl-(meth)acrylamide, N,N'-dimethyl(meth)acrylamide, N,N'-dimethylaminopropyl(meth)acrylamide, N,N'-diemthylaminoethyl(meth)acrylate, N,N'-diethylaminoethyl(meth)acrylate, N,N'-dimethylaminoneopentyl(meth)acrylate, N-vinyl-2-pyrrolidone, diacetone acrylamide, N-methylol(meth)acrylamide, parastyrene sulfonic acid or its salt, methoxytriethylene glycol (meth)acrylate, methoxytetraethylene glycol (meth)acrylate, methoxypolyethylene glycol (meth)acrylate (PEG number-average molecular weight: 400), methoxypolyethylene glycol (meth)acrylate (PEG number-average molecular weight: 1,000), butoxyethyl(meth)acrylate, phenoxyethyl(meth)acrylate, phenoxydiethylene glycol (meth)acrylate, phenoxyethylene glycol (meth)acrylate, phenoxypolyethylene glycol (meth)acrylate, nonylphenoxyethyl (meth)acrylate, dimethylol tricyclodecane di(meth)acrylate, diethylene glycol di(meth)acrylate, tetraethylene glycol di(meth)acrylate, polyethylene glycol di(meth)acrylate (PEG number-average molecular weight: 400), polyethylene glycol di(meth)acrylate (PEG number-average molecular weight: 600), polyethylene glycol di(meth)acrylate (PEG number-average molecular weight: 1,000), polypropylene glycol di(meth)acrylate (PEG number-average molecular weight: 400 ), 2,2-bis[4-((meth)acryloyloxyethoxy)phenyl]propane, 2,2-bis[4-((meth)acryloyloxy-diethoxy)phenyl]propane, 2,2-bis[4-((meth)acryloyloxy.polyethoxy)phenyl]propane, β-(meth)acryloyl-oxyethyl hydrogen phthalate, β-(meth)acryloyl-oxyethyl hydrogen succinate, polyethylene or polypropylene glycol mono(meth)acrylate, 3-chloro-2-hydroxypropyl(meth)acrylate, 1,3-buthylene glycol di(meth)acrylate, 1,6-hexanediol di(meth)acrylate, neopentyl glycol di(meth)acrylate, trimethylolpropane tri(meth)acrylate, tetramethylol methane tri-(meth)acrylate, tetramethylol methane tetra(meth)acrylate, isobornyl(meth)acrylate, lauryl(meth)acrylate, tridecyl-(meth)acrylate, stearyl(meth)acrylate, isodecyl(meth)acrylate, cychlohexyl(meth)acrylate, tetrafurfuryl (meth)acrylate, benzyl(meth)acrylate, mono(2-(meth)acryloyloxyehyl)acid phosphate, glycerin mono(meth)acrylate or di(meth)acrylate, tris(2-(meth) achryloyloxyethyl)isocyanurate, and 2-isocyanatoethyl (meth) acrylate; a combination of the above polyfunctional (meth)acrylic monomers with monofunctional (meth)acrylate; a combination of the above polyfunctional (meth) acrylic monomers with the above (meth)acrylate monomers containing hydrophilic groups; polyfunctional allyl compounds such as N-phenylmaleimide, N-(meth)acryloxy succinic acid imide, N-vinylcarbazol, divinylethylene urea, divinylpropylene urea and triallyl isocyanurate, or a combination of the above polyfunctional allyl compounds with monofunctional allyl compounds; liquid rubber, which contains reactive groups like a hydroxyl group, a carboxyl group, an amino group, a vinyl group, a thiol group and an epoxy group at both termini of polymer molecule, such as 1,2-polybutadiene, 1,4-polybutadiene, hydrogenated 1,2-polybutadiene and isoprene; various telechelic polymers such as urethane(meth)acrylate; reactive wax containing carbon-carbon unsaturated groups, hydroxyl groups, carboxyl groups, aminogroups and epoxy groups; and polyfunctional epoxy compounds such as propylene glycol diglycidyl ether, tripropylene glycol diglycidyl ether, polypropylene glycol diglycidyl ether, neopentyl glycol diglycidyl ether, trimethylol propane triglycidyl ether or hydrogenated bisphenol A diglycidyl ether. Further, (meth)acryl copolymers, urethane acrylate and diazo resins used as components for images of the known PS plates can be used when they are cross-linked.

The form of the oleophilic materials can be either solid or liquid at room temperature. The polyisocyanate compounds in the form of solid at room temperature include tolidine diisocyanate, 4,4'-diphenyl methane diisocyanate, naphthalene diisocyanate, polymethylene polyphenyl isocyanate and polymeric polyisocyanate.

The following heat polymerization initiators can be used to chemically react the oleophilic material and the hydrophilic binder polymer or to react the oleophilic materials per se through the double bonding reaction of addition polymerizable ethylenically monomers and oligomers contained in the oleophilic materials. The heat polymerization initiator is preferably stable at a storage temperature of 50° C. or less, more preferably stable at a storage temperature of 60° C. or less. The examples include peroxides such as methyl ethyl ketone peroxide, cychlohexane peroxide, n-butyl-4,4-bis(t-butylperoxy)valerate, 1,1-bis(t-butylperoxy)cychlododecane, 2,2-bis(t-butylperoxy)butane, cumenehydroperoxide, p-menthane hydroperoxide, di-t-butylperoxide, t-butylcumylperoxide, dicumylperoxide, t-butylperoxylaurate, t-butylperoxyisopropyl carbonate, t-hexylperoxybenzoate, t-butylperoxybenzoate, and t-butylperoxyacetate. The heat polymerization initiator may be dispersed in the hydrophilic layer in the form of capsule-in-capsule, i.e., a microcapsuled heat polymerization initiator contained in a microcapsule of oleophilic material, or in the form of the initiator per se. The oleophilic material is hardened not only by a polymerization reaction but also by a reaction for chemically bonding the oleophilic material and the hydrophilic binder polymer.

From the standpoint of improving the printing durability of image areas, the image areas of the present invention preferably have a urethane or urea structure. Such a structure can be obtained by the heat reaction caused by printing oleophilic material or by preliminarily introducing the urethane or urea structure into the segment of the oleophilic material or the hydrophilic binder polymer.

The oleophilic material can be capsuled according to the known method disclosed in such texts as a *New Technology for Microcapsulation; Its Use Development and Practical Examples*, edited by Management Developing Center, Management Education Dept., Management Developing Center, Publication Dept., 1978. The capsulation can be carried out according to, for example, an interfacial polymerization method wherein reactants which are preliminarily added to each solution are polycondensed at the interfaces of the incompatible solutions to form polymer membranes, i.e., capsule membranes, which are insoluble to both the solutions; an in-situ method wherein reactants are introduced from either inside or outside of a core material to form a polymer wall around the core material; a complex coacervate method wherein a hydrophilic polymer is separated out on the surface of a hydrophobic substance dispersed in the hydrophilic polymer solution to form a capsule membrane; and phase separation method from organic solutions. Of these, the interfacial polymerization method and the in-situ method are preferable since relatively many core substances are easily capsuled. The oleophilic material may be capsuled using the different material from the oleophilic material. The capsulation of the present invention includes a method wherein the surface of the fine powder of polyisocyanate compounds in the form of solid at room temperature are blocked with the above-mentioned blocking agents so as not to react the polyisocyanate compounds with active hydrogen at room temperature. It is necessary to release the capsuled oleophilic material from the capsule with the heat at printing to break the initial capsule. The oleophilic material is released by the expansion, compression, melting and chemical decomposition of the capsule wall, or released through the capsule wall material by decrease of the wall density due to the expansion of the wall material.

The surface of the capsule is preferably hydrophilic, but not particularly so limited if the non-image areas are not scummed at the printing under the condition that microcapsules are contained in the hydrophilic layer. The size of the microcapsules is 10 μm or less in average. For high resolution, it is preferably 5 μm or less in average. When the ratio of the oleophilic material to the whole capsule is too low, the efficiency in forming image areas is decreased. Therefore, the size of the microcapsules is preferably 0.01 μm or more in average.

The amount of the microcapsuled oleophilic materials used is determined according to the required printing durability which depends on the purpose of the use. Generally, the weight ratio of microcapsule/hydrophilic binder polymer is in the range of 1/20 to 10/1. From the standpoint of the sensitivity and the printing durability, it is preferably in the range of 1/15 to 5/1.

The sensitizers can be added as the other component to the hydrophilic layer of the present invention for the purpose of accelerating the heat breaking of the capsule, accelerating the reaction of the oleophilic material and the reactive material having functional groups which react with the oleophilic material, and accelerating the reaction between the oleophilic material and the hydrophilic binder polymer. By adding the sensitizers, increase of printing sensitivity, improvement in the printing durability and high speed platemaking are attained. These sensitizers include self-oxidation substances such as nitrocellulose, and high distortion compounds such as substituted cyclopropane, or cubane. The catalyst for a polymerization reaction of the oleophilic material can be used as a sensitizer. When the polymerization reaction of the oleophilic material is a reaction of isocyanate groups, urethane catalysts such as dibutyltin dilaurate, stannic chloride and an amine compound are exemplified as the catalyst for the polymerization reaction. In case of a ring-opening reaction of epoxy groups, ring-opening catalysts such as quaterly ammonium salt are exemplified. The sensitizers can be added at the time of preparing the dope, capsuled at the time of microcapsuling the oleophilic material, or arranged with the binder resin between the substrate and the hydrophilic layer. The amount of the sensitizers used is determined in view of its efficiency, printing durability of the non-image areas.

In case of laser imaging, substances for converting light into heat which have absorption bands in the region of luminance wavelength of a laser can be used. Such substances include dyes, pigments and coloring materials, which are disclosed in *JOEM Handbook 2 Absorption Spector of Dyes for Dyode Lasers*, MATSUOKA, Ken, Bunshin Shuppan, 1990 and Chapter 2, 2.3 of *Development and Market Trend of Functional Coloring Materials* in 1990's, CMC Editorial Department, CMC, 1990, such as a polymethine type coloring material (cyanine coloring material), a phtharocyanine type coloring material, a dithiol metallic complex salt type coloring material, naphtoquinone, an anthraquinone type coloring material, a triphenylmethane type coloring material, aluminium, a di-iminonium type coloring material, an azo type dispersion dye, an indoaniline metallic complex coloring material, and an intermolecular CT coloring material. The representative examples include N-[4-[5-(4-dimethylamino- 2-methylphenyl)-2,4-pentadienylidene]-3-methyl- 2,5-cyclohexadiene-1-ylidene]-N,N-dimethylammonium acetate, N-[4-[5-(4-dimethylaminophenyl)-3-phenyl-2-pentene-4-in-1-ylidene]-2,5-cyclohexadiene-1-ylidene]-N,N-dimethylammonium perchlorate, N,N-bis(4-dibutylaminophenyl)-N-[4-[N,N-bis(4-dibutylaminophenyl)amino]phenyl]-aminium hexafluoroantimonate, 5-amino-2,3-dicyano-8-(4-ethoxyphenylamino)-1,4-naphtoquinone, N'-cyano-N-(4-diethylamino-2-methylphenyl)-1,4-naphtoquinonedii mine, 4,11-diamino-2-(3-methoxybutyl)-1-oxo-3-thioxopyrrolo[3,4-b]anthracene-5,10-dion, 5,16-(5H,16H)-diaza- 2-butylamino-10,11-dithiadinaphtho[2,3-a:2'3'-c]-naphthalene- 1,4-dione, bis(dichlorobenzene-1,2-dithiol)nickel( 2:1)tetrabutylammonium, tetrachlorophthalocyanin aluminium chloride, and polyvinylcarbazol-2,3-dicyano-5-nitro-1,4-naphthoquinone complex.

In order to facilitate the heat break of microcapsules, substances easy to evaporate or expand its volume when heated with the oleophilic material can be capsuled with the oleophilic material. Such substances include hydrocarbon, hydrocarbon halogenide, alcohol, ether, ester and ketone compounds having a much higher boiling point than room temperature, i.e., about 60° to 100° C., such as cyclohexane, diisopropyl ether, ethylacetate, ethylmethylketone, tetrahydrofuran, t-butanol, isopropanol, or 1,1,1-trichloroethane.

The known thermosensitive coloring materials being colored only at imaging areas is used together with the oleophilic material to visualize the imaging areas. As a result, the obtained plates can be easily examined. As the combination of the thermosensitive coloring materials and the oleophilic material, a combination of leuco dyes such as 3-diethylamino-6-methyl-7-anilinofluorane and bisphenol A and ground developers is proposed. The thermosensitive coloring materials disclosed in books such as *Coloring Material Handbook*, edited by OKAWARA, Shin et al., Kodansha, 1986 can be used.

In addition to the hydrophilic binder polymer, reactive substances, which have functional groups reacting with the oleophilic materials, can be employed in order to enhance the cross-linking degree of the oleophilic material. The amount added is determined according to the ink repellency and hydrophilic property of the hydrophilic binder polymer. The amount should be in the range where scumming is not appeared. Such reactive substances include, in case that urethane is formed by the cross-linking reaction, compounds having a plurality of a hydroxyl group, an amino group and a carboxyl group such as polyvinyl alcohol, polyamine, polyacrylic acid and trimethylol propane.

For the purpose of adjusting the hydrophilic property, a non-reactive hydrophilic polymer which does not react with the hydrophilic binder polymer and the oleophilic material used in the present invention may be added in the range where the printing durability is not deteriorated.

In case of imaging with a thermal print-head, in order to prevent the sticking of melted materials generated by heating to the thermal print-head, the known compounds such as calcium carbonate, silica, zinc oxide, titanium oxide, kaolin, calcined kaolin, hydrate halloysite, alumina sol, diatomaceous earth and/or talc are added as an absorber of the melted materials.

Further, in order to improve the sliding property of a printing plate and to prevent printing plates from adhering when the plates are piled, solid lubricants at room temperature such as stearic acid, millistin acid, dilaurilthiodipropionate, amide stearate, and zinc stearate can be added to the hydrophilic layer in a small amount.

The substrate used in the present invention can be selected from the known materials in view of the performance required in the printing field and the cost. When a high dimensional accuracy is required, for example, in case of multicolor printing, and when a printing machine wherein the installation of a plate to a plate cylinder is made according to the types of its metallic substrate is used, metallic substrates made of aluminium, steal and the like are preferred. when multicolor printing is not conducted and high printing durability is required, plastic substrates made of polyester can be used. In the field where further lower cost is required, substrates made of paper, synthetic paper, waterproof resin laminate and coated paper can be used. For the purpose of improving the adhesive property between a substrate and the material contacting thereto, a substrate whose surface is treated may be employed. Such surface treatments includes various polishing treatments and an anodizing treatment for aluminum sheet, and a corona discharge treatment and a blast treatment for plastic sheet.

If necessary, a layer made of adhesive agents is arranged on the substrate depending on the printing durability and the like. Generally, the layer made of adhesive agents is arranged when a high printing durability is required. The adhesive agents must be selected and constructed according to the hydrophilic layer and the substrate to be used. Acryl, urethane, cellulose and epoxy type adhesive agents can be used, which are disclosed in, for example, *Dictionary for Adhesion and Viscosity*, supervised by YAMADA, Shozaburo, Asakura Shoten, 1986; *Handbook for Adhesion*, edited by the Adhesion Society of Japan, Nihon Kogyo Shimbun, 1980; and the like.

The thermosensitive lithographic printing original plate can be prepared by the following procedure. The above-mentioned components are well dispersed with a solvent selected according to the type of the components and the cross-linking methods of the hydrophilic binder polymer using a paint shaker, a ball mill, a ultrasonic homogenizer and the like. The resultant coating solution (dope) is applied to the substrate according to the conventional methods such as a doctor blade method, a bar coat method and a roll coat method and dried to obtain a thermosensitive lithographic printing material. As the solvents, there can be used water, alcohols such as ethanol, isopropanol, and n-butanol, ketones such as acetone and methylethylketone, ethers such as diethylene glycol ethylether, diisopropyl ether, dioxane, tetrahydrofuran and diethylene glycol, esters such as ethyl acetate and butyl acetate, aromatic hydrocarbons such as toluene and xylene, aliphatic hydrocarbons such as n-hexane and decalin, dimethylformamido, dimethylsulphoxide, acetonitrile, and mixed solvents thereof. If necessary, the hydrophilic binder polymer is heated at a lower temperature than the temperature at which microcapsuled are broken or is irradiated to ultraviolet ray in order to attain a three-dimensional cross-link. The thickness of the coating may be optionally fixed between several micro meters and 100 μm. From the standpoint of the plate performance and cost, the preferred thickness is generally from 1 to 10 µm. If it is necessary to improve the smoothness of the surface, the original plate is calendered after application and dry or after the tree-dimensional cross-linking reaction of the hydrophilic binder polymer. If particularly high smoothness is required, the calender treatment is preferably carried out after application and dry.

The thermosensitive lithographic printing original plate of the present invention is prepared by drawing and imaging letters and images edited by a computer type setting machine, DTP, a word processor, a personal computer and the like with a thermal print-head and thermal mode laser, and it does not take a developing process at all. After imaging, the cross-linking degree can be enhanced by postcuring the plate at a temperature capsules are not broken or by irradiating whole surface of the plate to active light. In the latter case, it is necessary to contain both the above-mentioned light polymerization initiator or light cation polymerization initiator and a compound having functional groups which react with such initiators in the hydrophilic layer or to introduce the above functional groups into the oleophilic material. The initiators and the compounds having the functional group include, in addition to the above list, the known ones disclosed in *Ultraviolet Hardening System*, KATO, Kiyoshi, Sogo Gijutsu Center, 1989, *Handbook for Hardening UV and BE* (Original Material), edited by KATO, Kiyoshi, Kobunshi Kanko-kai, 1985, and the like.

The obtained printing plate as above is put in a commercially available offset printing machine to print in accordance with the normal printing methods. At printing, the printing plate can be subjected to a common etch treatment prior to the printing if necessary.

BEST MODE FOR CARRYING OUT THE INVENTION

The present invention will be illustrated in more detail with reference to the following non-limiting Examples. Parts refers to parts by weight unless otherwise indicated. The average molecular weight between cross-links is expressed by the designedly calculated value, assuming the reaction has finished.

Preparation of Hydrophilic Binder Polymer P-1

A mixture containing 5.8 g of 2-hydroxyethylacrylate, 16.2 g of acrylic acid, 16.0 g of acrylamide, 0.2 g of dodecylmercaptane as a chain transfer agent, and 100 g of water/isopropyl alcohol (50/50 wt.) was heated to 70° C. with stirring. 0.38 g of 2,2-azobis(isobutyronitrile) (hereinafter AIBN) was added to the mixture as a heat polymerization initiator, and reacted for 4 hours. Then, 6.4 g of glycidyl methacrylate and 0.5 g of t-butylhydroquinone as a polymerization inhibitor, and 1 g of benzyltrimethyl ammonium chrolide (hereinafter BTMAC) were added to the reaction mixture, and reacted for 6 hours at 130° C. A polymer was precipitated with acetone, washed, and purified to obtain a Hydrophilic Binder Polymer P-1 (number-average molecular weight measured by GPC: $1.5 \times 10^4$; average molecular weight between cross-links: $0.8 \times 10^3$; contact angle measured with an oil drop in water (water-kerosine): 160° or more).

Preparation of Hydrophilic Binder Polymer P-2

A mixture containing 5.8 g of 2-hydroxyethylacrylate, 16.2 g of acrylic acid, 16.0 g of acrylamide, 0.2 g of dodecylmercaptane, and 100 g of isopropyl alcohol/toluene (50/50 wt.) was heated to 70° C. with stirring. 0.3 g of AIBN was added to the mixture, and reacted for 4 hours. A polymer was precipitated with acetone, washed, and purified to obtain a Hydrophilic Binder Polymer P-2 (number-average molecular weight: $1.7 \times 10^4$; contact angle measured with an oil drop in water (water-kerosine): 160° or more).

Preparation of Hydrophilic Binder Polymer P-3

A mixture containing 52.2 g of 2-hydroxyethylacrylate, 35.5 g of acrylamide, 3.6 g of acrylic acid, 0.9 g of dodecylmercaptane, and 100 g of water/isopropyl alcohol (50/50 wt.) was heated to 70° C. in a reaction vessel. 1 g of AIBN was added to the mixture, and reacted for 5 hours. Then, 7.2 g of glycidylmethacrylate, 0.5 g of t-butylhydroquinone, and 1 g of BTMAC were added to the reaction mixture, and they were reacted for 6 hours at 130° C. A polymer was precipitated with acetone, washed, and purified to obtain a Hydrophilic Binder Polymer P-3 (number-average molecular weight measured by GPC: $1.8 \times 10^3$; contact angle measured with an oil drop in water (water-kerosine): 160° or more).

Preparation of Hydrophilic Binder Polymer P-4

A mixture containing 58 g of 2-hydroxyethylacrylate, 35.5 g of acrylamide, 0.9 g of dodecylmercaptane, and 100 g of water was heated to 70° C. in a reaction vessel. 1 g of AIBN was added to the mixture, and reacted for 5 hours. A polymer was precipitated with acetone, washed, and purified to obtain a Hydrophilic Binder Polymer P-4 (number-average molecular weight measured by GPC: $1.5 \times 10^4$; contact angle measured with an oil drop in water (water-kerosine): 160° or more).

Preparation of Hydrophilic Binder Polymer P-5

33.8 g of acrylamide, 1.8 g of acrylic acid and 11.6 g of 2-hydroxyacrylate were dissolved in 320 g of ethyl acetate/toluene (80/20 wt.). Nitrogen gas was introduced into the mixture and heated to 45° C. with stirring. Then, 0.41 g of AIBN which was dissolved in 20 g of ethyl acetone/toluene (80/20 wt.) was added to the reaction mixture to conduct a 6 hour reaction at 55° C. The resultant polymer in the form of a slurry was filtrated and repeatedly washed to purify. 20 g of the polymer was dissolved in 270 g of water and heated to 80° C while introducing air. 0.4 g of 2,6-ditertiary butyl paracresol (hereinafter BHT), a polymerization inhibitor dissolved in isopropyl alcohol, 4.8 g of trimethyl benzylammonium hydroxide (hereinafter TMBAHO) and 16.2 g of glycidyl methacrylate were added to the above solution to react for 4 hours until the acid value reached zero. The polymer was vacuum dried to obtain Hydrophilic Binder Polymer P-5 (number-average molecular weight measured by GPC: $1.9 \times 10^5$; average molecular weight between crosslinks: $1.8 \times 10^3$; contact angle measured with an oil drop in water (water-kerosine): 160° or more).

Preparation of Hydrophilic Binder Polymer P-6

100 g of polyyoxyethylene glycol (number-average molecular weight: $1 \times 10^3$) and 25.2 g of 1,6-hexamethylene diisocyanate were stirred at 80° C. to synthesize a chain-lengthening polymer which has isocyanate groups at both ends. Then, the reaction mixture was heated to 85° C., to which dried air was introduced and 32 g of glycerin monomethacrylate and 0.1 g of BHT were added. The mixture was reacted until no isocyanate characteristic absorption is recognized in the infrared spectrum to obtain Hydrophilic Binder Polymer P-6 (number-average molecular weight: $2.8 \times 10^3$; average molecular weight between cross-links: $2.8 \times 10^3$; contact angle measured with an oil drop in water (water-kerosine): 160° or more).

Preparation of Microcapsuled Oleophilic Material M-1

10 g of Coronate L desolvated to be a solid (an adduct of trimethylolpropane and 2,4-tolylene diisocyanate (molar ratio of 1:3)), 8 g of ethyl alcohol, 2 g of distilled water, and 80 g of 5% aqueous solution of polyacryl amide were put in a vessel, and stirred at room temperature for 1 hour with a paint shaker to obtain microcapsuled isocyanate M-1 whose surface was blocked. The average diameter of the obtained primary dispersed particles was 1.0 μm.

Preparation of Microcapsuled Oleophilic Material M-2

50 g of diglycidyl ether of bisphenol A was heat melted and put in 200 g of gelatin solution treated with 5% acid at 60° C. for emulsion dispersion. When the diameter of oil particles become 3 μm in average, 5% carboxymethyl cellulose solution (etherification degree of 0.6, average polymerization degree of 160) was added and a pH value was adjusted to 5.5. Then, the solution was cooled to 10° C. 12 g of 10% formalin was added to the solution and its pH value was adjusted to 10 with 10% caustic soda to obtain Microcapsuled Oleophilic Material M-2.

Preparation of Microcapsuled Oleophilic Material M-3

13.2 g of 3,3'-dimethylbiphenyl-4,4'-diisocyanate, 5.9 g of 2-hydroxyethylacrylate and 0.05 g of dibutyltin dilaurate, a catalyst, were dissolved in 80 g of ethyl acetate. The mixture was stirred at 50° C. for 15 minutes and reacted at 70° C. for 2 hours to synthesize a compound having acryl groups and isocyanate groups in one molecule. Then, the solvent was distilled and vacuum dried. The resultant solid was ground in a mortar, then 5% polyvinyl alcohol of water/ethanol (5.5/2.5 wt. ratio) and alumina ball were added thereto in the substantially same amount as the ground solid. Then, they were stirred with a paint shaker for 1 hour to obtain ground Microcapsuled Oleophilic Material M-3. The average diameter of the obtained primary dispersed particles was 0.9 μm.

Preparation of Microcapsuled Oleophilic Material M-4

3 g of polyoxyethylene nonylphenyl ether (HLB15), 3 g of partially saponified polyvinyl alcohol and 5 g of polyoxyethylene glycol (number-average molecular weight: $2 \times 10^3$) were dissolved and dispersed in 150 g of water to prepare an emulsifier solution. The resultant solution was put in a homogenizer and the temperature was maintained at 60° C. 5 g of trimethyrol propane triacrylate, 10 g of teraethylene glycol dimethacrylate, 5 g of lauryl acrylate and 0.44 g of 1,6-hexamethylene diisocyanate which were preliminary mixed at 60° C. were added thereto and stirred for 3 hours at 8000 r.p.m. to obtain Microcapsuled Oleophilic Material M-4 having an average particle diameter of 2.4 μm.

EXAMPLE 1

A 180 μm thick polyester substrate coated with a urethane type adhesive agent was coated with a dope comprising the following components, which was preliminarily well dispersed with a paint shaker at room temperature for 30 minutes and defoamed, using a blade coater.
Hydrophilic Binder Polymer P-1 (solid content of 15%): 12.0 parts
Microcapsuled Oleophilic Material M-1 (solid content of 20%): 6.0 parts
AIBN: 1.0 part
Calcium carbonate (absorber): 0.8 part
Zinc stearate (lubricant): 0.5 part
Water: 18.7 parts Next, the coated substrate was air dried for 30 minutes, dried in a vacuum dryer at 30° C. for 3 hours and calendered to obtain a lithographic printing material. Further, the material was dried and reacted at 400° C. for 4 hours to obtain a lithographic printing original plate having an average coating thickness of 4.5 μm.

The original plate was made into a printing plate, without a developing process, by setting images using a platemaker equipped with a thermal print-head (TPH-293R7 manufactured by TOSHIBA CORPORATION) which was connected to a computer type setting machine. The obtained printing plate was trimmed into a prescribed size, and the trimmed plate was put into an offset printing machine (HAMADA611XL manufactured by Hamada Printing Press Co., Ltd. employing a hard blanket). Printing was conducted on wood free paper (ink used: BSD offset ink new rubber black gold; an etch treatment; a dampening water prepared by diluting an etch solution 50 times with water). After 20,000 copies were printed, the printing plate did not collect scumming and image areas were also clearly printed. The difference in reflection density between paper and non-image areas on the paper was measured with a reflection densitometer (DM400 manufactured by DAINIPPON SCREEN MFG. CO., LTD.). The difference between them was not more than 0.01.

EXAMPLE 2

A lithographic printing original plate having an average coating thickness of 3 μm was obtained according to the same procedure as in Example 1 except that, in the dope components of Example 1, Hydrophilic Binder Polymer P-1 was changed to P-3, and 2.0 parts of trimethylolpropane as a cross-linker, 2.0 parts of 3-diethylamino-6-methyl-7-anilinofluorane (solid content of 40 % average particle diameter of 2.5 μm) as a color former and 10.0 parts of bisphenol A dispersion solution (solid content of 30%, average particle diameter of 2.5 μm) were further employed. Then, the original plate was made into a printing plate and printing was conducted.

The image areas of the printing plate prepared without a developing process were colored in black after printing so that the plate was easily examined. As a result of printing, the plate did not collect scumming and clear prints were obtained after 30,000 copies were printed. The difference in reflection density between paper and non-image areas on the paper was not more than 0.01.

EXAMPLE 3

Instead of the polyester substrate, an electrolytic polished aluminum substrate was coated with the dope comprising the following components according to the same procedure as in Example 1 (average molecular weight between cross-links of Hydrophilic Binder Polymer: $2.5 \times 10^3$). The coated plate was air dried for 30 minutes, dried in a vacuum drier at 30° C. for 3 hours and calendered to obtain a lithographic printing material. Further, the printing material was dried and reacted at 60° C. for 8 hours to obtain a lithographic printing original plate having an average coating thickness of 2.5 μm. The obtained original plate was made into a printing plate and printing was carried out.
Hydrophilic Binder Polymer P-2 (solid content of 20%): 12.5 parts
Glycerol trisanhydrotrimellitate: 0.2 part
Microcapsuled Oleophilic Material M-2 (solid content of 20%): 7.0 parts
Hydrated halloysite (absorber): 1.0 part
Stearic acid amide (lubricant): 1.0 part
3-diethylamino-6-methyl-7-anilinofluoran (solid content of 40 % average particle diameter of 2.5 μm): 2.0 parts
Bisphenol A dispersion solution (solid content of 30% and average particle diameter of 2.5 μm): 10.0 parts
Water: 18.5 parts The image areas of the printing plate obtained without a developing process could be easily examined. After 10,000 copies were printed, the printing plate did not collect scumming and clear prints were obtained. The difference between paper reflection density of non-image areas before and after printing was no more than 0.01.

EXAMPLE 4

An electropolished aluminum substrate was coated with the dope comprising the following components using a blade coater.
15% toluene solution of Hydrophilic Binder polymer P-4: 12.0 parts
Hexamethylene diisocyanate derivative masked with acid sodium sulfite: 0.25 part
Microcapsuled Oleophilic Material M-1 (solid content of 99%): 1.2 parts
Kaolin (absorber): 5.0 parts
Toluene: 18.0 parts Next, the coated plate was air dried for 30 minutes to obtain a lithographic printing material. The material was dried in a vacuum drier at 55° C. for 4 hours and calendered to obtain a lithographic printing original plate having an average coating thickness of 3 μm. Further, in accordance with the same procedure as in Example 1, the obtained original plate was made into a printing plate and printing was carried out. After 20,000 copies were printed, the printing plate did not collect scumming and clear prints were obtained. The difference in reflection density between paper and non-image areas on the paper was not more than 0.01.

EXAMPLE 5

A lithographic printing original plate having an average coating thickness of 3 μm was prepared according to the same procedure as in Example 1 except that 0.5 part of nitrocellulose (nitration degree of 1.8) was added to the dope of Example 2 as a sensitizer. The obtained original plate was made into a printing plate and printing was carried out according to the same procedure as in Example 2. Prints having the same quality as in Example 2 were obtained with 70% applied energy of Example 2. The difference in reflection density between paper and non-image areas on the paper was not more than 0.01.

EXAMPLE 6

One side of a 200 μm thick aluminum sheet degreased with alkali was coated with γ-acryloxypropyltrimethoxysilane and cured at 50° C. for 1 hour to prepare a substrate. The resultant substrate was further coated with a dope comprising the following components using a blade coater.
Hydrophilic Binder Polymer P-5 (solid content of 15%): 5.0 parts
Microcapsuled Oleophilic Material M-3 (solid content of 15%): 25.0 parts
(2-acryloyloxyethyl)(4-benzoylbenzyl)dimethyl ammonium bromide (light polymerization initiator): 0.01 part
KIP-103 (phthalocyanine type pigment manufactured by MITSUI TOATSU CHEMICALS, INC.): 0.03 part
Partially saponified polyvinyl alcohol (solid content of 5%): 10.0 parts
Water: 16.0 parts Next, the coated plate was air dried for 30 minutes and dried at 40° C. for 3 hours to obtain a lithographic printing material. Further, the printing material was irradiated at 6 J/cm$^2$ by a chemical lamp to obtain a lithographic printing original plate having an average coating thickness of 4 μm. The obtained original plate was put in an imaging machine equipped with 1W semiconductor laser elements and connected to a computer type setting machine to thermal print images and the whole plate surface was irradiated by a high pressure mercury-arc lamp for 1 minute without developing process to obtain a printing plate. The plate was trimmed and printing was conducted in accordance with the same procedure as in Example 1. After 50,000 copies were printed, the printing plate did not collect scumming and clear prints were obtained. The difference in reflection density between paper and non-image areas on the paper was not more than 0.01.

EXAMPLE 7

The substrate used in Example 6 was coated with the dope comprising the following components using a blade coater.
Hydrophilic Binder Polymer P-6 (solid content of 15%): 5.0 parts
Microcapsuled Oleophilic Material M-1 (solid content of 20%): 20.0 parts
(2-acryloyloxyethyl)(4-benzoylbenzyl)dimethyl ammonium bromide (light polymerization initiator): 0.01 part KIP-101 (anthraquinone type pigment manufactured by MITSUI TOATSU CHEMICALS, INC.): 0.01 part
Partially saponification polyvinyl alcohol (solid content of 5%): 10.0 parts
Water: 16.0 parts Next, the coated plate was air dried for 30 minutes and dried in a vacuum dryer at 30° C. for 3 hours to obtain a lithographic printing material. Further, the printing material was irradiated at 6 J/cm$^2$ using a chemical lamp to obtain a lithographic printing original plate having an average coating thickness of 3.5 μm. A printing plate was prepared from the original plate using the imaging machine in Example 6 without a developing process. The plate was trimmed and printing was conducted in accordance with the same procedure as in Example 1. After 20,000 copies were printed, the printing plate did not collect scumming and clear prints were obtained. The difference in reflection density between paper and non-image areas on the paper was not more than 0.01.

EXAMPLE 8

A 200 μm thick polyester film subjected to corona discharge treatment was quickly coated with a dope comprising the following components prepared at between 5 and 10° C. using a blade coater.
Polyallylamine (a hydrophilic binder polymer, PAA-H manufactured by Nitto Boseki Co. Ltd., 20% solution): 12.0 parts
Polyethylene glycol diglycidyl ether (number of replication of oxyethylene groups of 23): 1.0 part
Microcapsuled Oleophilic Material M-3 (solid content of 15%): 6.5 parts
Microcapsuled Oleophilic Material M-4 (solid content of 15%): 3.0 parts
Silica: 0.5 part
3-diethylamino-6-methyl-7-anilinofluoran: (solid content of 40%, average particle diameter of 2.5 μm): 0.5 part
Bisphenol A dispersion solution (solid content of 30%, average particle diameter of 2.5 μm): 0.5 part
Water: 18.0 parts Next, the coated plate was dried in a vacuum drier at 20° C. for 3 hours while gradually increasing a degree of vacuum so as not to make a bubble, and was reacted at 40° C. for 1 hour to dry up. Then, the plate was immersed in a 10% HCl solution, removed from the solution for washing with water and dried at 40° C. for 1 hour. The dried plate was calendered to obtain a lithographic printing original plate having an average coating thickness of 3 μm. In accordance with the procedure in Example 1, the original plate was made into a printing plate and printing was conducted. After 20,000 copies were printed, the plate did not collect scumming and clear prints were obtained. The difference in reflection density between paper and non-image areas on the paper was not more than 0.01. The film on the substrate obtained from the above polyamine cross-linked with the above glycidyl ether had a contact angle measure with an oil drop in water (water-kerosine) or 160° or more.

Comparative Example 1

The same dope as in Example 1 was prepared except that, instead of Microcapsuled Oleophilic Material M-1, a wax without reactive groups having an average particle diameter of 1.0 μm was added in the same amount as Microcapsuled Oleophilic Material M-1. Coating, platemaking and printing were carried out according to the same procedure as in Example 1. As a result, image areas of prints became foggy after about 600 copies were printed.

Comparative Example 2

Using the dope comprising the same components except that, instead of Microcapsuled Oleophilic Material M-1, a microcapsule prepared by capsuling methylmethacrylate-styrene-diethylene glycol dimethacrylate type microgel (average particle diameter of 0.5 μm, non-containing reactive functional groups) with acidic gelatin according to a coacervation method was employed in the same amount as Microcapsuled Oleophilic Material M-1, a lithographic printing original plate was prepared. Then, platemaking and printing were carried out in accordance with the same procedure as in Example 1. As a result, image areas of prints became foggy after about 2,000 copies were printed. The printing was stopped to carefully wipe ink on the printing plate and foggy areas of the printing plate were observed with SEM. Dents as big as capsules were observed. Such dents were not observed in areas where fog did not appear.

Comparative Example 3

Using a dope comprising the same components except that glycerol trisanhydrotrimellitate was not employed, coating and drying were conducted according to the same procedure as in Example 3 to prepare a lithographic printing original plate. The original plate was made into a printing plate and printing was carried out as in Example 1. After 400 or 500 copies were printed, the plate collect scumming and a part of non-image areas of the plate began to peel off.

INDUSTRIAL APPLICABILITY

The thermosensitive lithographic printing original plate of the present invention comprises a three-dimensionally cross-linked hydrophilic binder polymer and a microcapsuled oleophilic material which comes out from the microcapsule by thermal imaging and chemically binds with the binder polymer to form image areas. Therefore, the resultant lithographic printing plate is particularly excellent in printing durability and prints having clear images can be obtained because the plate does not collect scumming. Consequently, the lithographic printing plate can be practically used as a printing material not only for a light printing mainly employed in offices but also for the printing such as in a newspaper rotary press and form printing.

The thermosensitive lithographic printing original plate of the present invention cannot react the oleophilic material with the hydrophilic binder polymer until imaging is carried out since the oleophilic material is microcapsuled. Further, it is not particularly necessary to be anxious about the scumming at the non-image areas and the original plate has high storage stability.

The thermosensitive lithographic printing original plate of the present invention does not particularly limit the design of plates since each component has each function.

Further, the thermosensitive lithographic printing original plate of the present invention markedly improves the easiness of platemaking since a thermal print-head does not need to be frequently cleaned due to very little adhesion on the thermal print-head when the contact imaging method is carried out.

The non-image areas of the thermosensitive lithographic printing original plate of the present invention are mainly formed by a three-dimensionally cross-linked hydrophilic polymer so that the platemaking of the present invention does not require a developing process. Increase in working efficiency and decrease in cost are attained since control of the developing solution and waste treatment are not necessary. The platemaking machine also becomes compact and the price of the machine is low even though accuracy is required.

What is claimed is:

1. A thermosensitive lithographic printing original plate comprising a substrate, a hydrophilic layer containing a hydrophilic binder polymer, and an oleophilic material which forms an image area by heating, wherein said oleophilic material is contained in a microcapsule, the hydrophilic binder polymer having a three-dimensional cross-link and a functional group which chemically combines with the oleophilic material in the microcapsule when the microcapsule is decomposed, and the microcapsuled oleophilic material having a functional group which chemically combines with the hydrophilic binder polymer when the microcapsule is decomposed.

2. The thermosensitive lithographic printing original plate according to claim 1, wherein the hydrophilic binder polymer is a polymer comprising carbon-carbon bonds, which have, as a side chain, at least one of hydrophilic functional groups selected from the group consisting of a carboxyl group or its salt, a phosphoric group or its salt, a sulfonic group or its salt, an amino group or its salt, a hydroxyl group, an amide group, and a polyoxyethylene group; or a polymer comprising carbon atoms or carbon-carbon bonds, which are connected by at least one of hetero atoms selected from oxygen, nitrogen, sulfur, and phosphorous; or a polymer comprising carbon atoms or carbon-carbon bonds, which are connected by at least one of hetero atoms selected from oxygen, nitrogen, sulfur, and phosphorous and which polymer has, as a side chain, at least one of hydrophilic functional groups selected from the group consisting of a carboxyl group or its salt, a phosphoric group or its salt, a sulfonic group or its salt, an amino group or its salt, a hydrogen group, an amide group, and a polyoxyethylene group.

3. The thermosensitive lithographic printing original plate according to claim 1, wherein the hydrophilic binder polymer contains a repeating segment having, as a side chain, any of a hydroxyl group, a carboxyl group or its alkaline metal salt, a sulphonic group or its amine salt, alkaline earth salt or its alkaline earth metal salt, an amino group or its hydrohalogenic acid salt, an amide group and a combination thereof.

4. The thermosensitive lithographic printing original plate according to claim 1, wherein the hydrophilic binder polymer has a polyoxymethylene group as a segment of its main chain.

5. The thermosensitive lithographic printing original plate according to claim 1, wherein the hydrophilic binder polymer has a urea or urethane bond in its segment or side chain.

6. The thermosensitive lithographic printing original plate according to claim 1, wherein the hydrophilic binder polymer has a difference in reflection density between paper and non-image areas on a paper of 0.02 or less.

7. The thermosensitive lithographic printing original plate according to claim 1, wherein the hydrophilic binder polymer comprises a hydrophilic homopolymer or a hydrophilic copolymer synthesized from one or more hydrophilic monomers having a hydrophilic group selected from a carboxyl group or its salt, a sulfonic group or its salt, a phosphoric group or its salt, an amino group or its salt, a hydroxyl group, an amide group and an ether group selected from the group consisting of a (meth)acrylic acid or its alkali metal salt and amine salt, an itaconic acid or its alkali metal salt and amine salt, 2-hydroxyethyl(meth)acrylate, (meth)acrylamide, N-monomethylol(meth)acrylamide, N-dimethylol-(meth)acrylamide, allyl amine or its hydrohalogenic acid salt, 3-vinylpropionic acid or its alkali metal salt and amine salt, vinyl sulfonic acid or its alkali metal salt and amine salt, 2-sulfoethyl(meth)acrylate, polyoxyethylene glycol mono(meth)acrylate, 2-acrylamide-2-methylpropanesulfonic acid, and acid phosphoxy polyoxyethlene glycol mono(meth)acrylate.

8. The thermosensitive lithographic printing original plate according to claim 1, wherein the hydrophilic binder polymer comprises polyoxymethylene glycol or polyoxyethylene glycol.

9. The thermosensitive lithographic printing original plate according to claim 1, wherein the oleophilic material comprises at least one selected from the group consisting of an isocyanate compound, a polyfunctional (meth)acryl monomer or a combination of the monomer with a monofunctional (meth)acrylate or a (meth)acrylate monomer containing a hydrophilic group, a polyfunctional allyl compound or a combination of the compound with a monofunctional (meth)acrylate compound or a (meth)acrylate compound containing a hydrophilic group, telechelic polymer, a reactive wax containing a reactive group selected from the group consisting of a carbon-carbon unsaturated bond group, a hydroxyl group, a carboxy group, an amino group and an epoxy group, a polyfunctional epoxy compound, a diazo resin, a (meth)acryl copolymer and urethane acrylate.

10. The thermosensitive lithographic printing original plate according to claim 1, wherein the oleophilic material has a urethane or urea structure.

11. The thermosensitive lithographic printing original plate according to claim 1, wherein the oleophilic material has a cross-linking structure.

12. The thermosensitive lithographic printing original plate according to claim 1, wherein the oleophilic material is contained in a microcapsule having an average particle diameter of 0.01 to 10 μm.

13. The thermosensitive lithographic printing original plate according to claim 1, wherein the weight ratio of the oleophilic material to the hydrophilic binder polymer is 1/20 to 10/1.

14. The thermosensitive lithographic printing original plate according to claim 1, wherein the chemical combination is an addition polymerization of an unsaturated group, a urethane or urea reaction of an isocyanate group with a reactive hydrogen, a reaction of a carboxyl group, a hydroxyl group or an amino group with an epoxy group.

15. The thermosensitive lithographic printing original plate according to claim 1, wherein the chemical combination forms a three-dimensional cross-link.

16. The thermosensitive lithographic printing original plate according to claim 1, wherein the hydrophilic layer contains a reactive substance which chemically combines with the oleophilic material.

17. The thermosensitive lithographic printing original plate according to claim 1, wherein the hydrophilic layer contains at least one absorber selected from the group consisting of calcium carbonate, silica, zinc oxide, titanium oxide, kaolin, calcinated kaolin, hydrated halloysite, alumina sol, diatom aceous earth, and talc.

18. The thermosensitive lithographic printing original plate according to claim 1, wherein the hydrophilic layer contains a solid lubricant at room temperature.

19. The thermosensitive lithographic printing original plate according to claim 1, wherein the oleophilic material contains a thermosensitive coloring material which is colored only at thermal imaging areas.

20. The thermosensitive lithographic printing original plate according to claim 1, wherein further an adhesion layer is arranged on the substrate.

21. A thermosensitive lithographic printing material comprising a substrate, a hydrophilic layer containing hydrophilic binder polymer, and an oleophilic material which forms an image area by heating, wherein said oleophilic material is contained in a microcapsule, the hydrophilic binder polymer having a functional group capable of three-dimensionally cross-linking and a functional group which chemically combines with the oleophilic material in the microcapsule when the microcapsule is decomposed, and the microcapsuled oleophilic material having a functional group which chemically combines with the hydrophilic binder polymer in the microcapsule when the microcapsule is decomposed.

22. A lithographic printing plate produced by printing a thermosensitive lithographic printing original plate according to a thermal recording method, the thermosensitive lithographic printing original plate comprises a substrate and a hydrophilic layer containing hydrophilic binder polymer and an oleophilic material which forms an image area by heating, wherein said oleophilic material is contained in a microcapsule, the hydrophilic binder polymer having a functional group capable of three-dimensionally cross-linking and a functional group which chemically combines with the oleophilic material in the microcapsule when the microcapsule is decomposed, and the microcapsuled oleophilic material having a functional group which chemically combines with the hydrophilic binder polymer in the microcapsule when the microcapsule is decomposed.

23. A platemaking process of a thermosensitive lithographic printing original plate comprising a step of printing the printing original plate according to a thermal recording method, the thermosensitive lithographic printing original plate comprising a substrate and a hydrophilic layer containing a hydrophilic binder polymer and an oleophilic material which forms an image area by heating, wherein said oleophilic material is contained in a microcapsule, the hydrophilic binder polymer being three-dimensionally cross-linked and having a functional group which chemically combines with the oleophilic material in the microcapsule when the microcapsule is decomposed, and the microcapsuled oleophilic material having a functional group which chemically combines with the hydrophilic binder polymer in the microcapsule when the microcapsule is decomposed.

24. The platemaking process of a thermosensitive lithographic printing original plate according to claim 23, wherein the whole plate is heated at a lower temperature than a break point of the microcapsule after imaging.

25. The thermosensitive lithographic printing original plate according to claim 2, wherein the hydrophilic binder polymer is poly(meth)acrylate, polyoxyalkylene, polyurethane, epoxy ring opening addition polymerization, poly(meth)acrylic acid, poly(meth)acrylamide, polyester type, polyamide, polyamine, polyvinyl, polysaccharide or composite thereof.

* * * * *

UNITED STATES PATENT AND TRADEMARK OFFICE
CERTIFICATE OF CORRECTION

PATENT NO. : 5,569,573
DATED : October 29, 1996
INVENTOR(S) : Gensho Takahashi et al.

It is certified that error appears in the above-identified patent and that said Letters Patent is hereby corrected as shown below:

<u>Title page,</u>
Please add the following information:

-- [22] PCT Filed:  April 19, 1994

PCT No.:  PCT/JP94/00643 --

Signed and Sealed this

Twenty-ninth Day of June, 2004

JON W. DUDAS
*Acting Director of the United States Patent and Trademark Office*